United States Patent [19]
Yoshioka

[11] Patent Number: 5,355,336
[45] Date of Patent: Oct. 11, 1994

[54] MEMORY DEVICE AND A METHOD FOR PROHIBITING WRITING TO THE MEMORY DEVICE

[75] Inventor: Katsuyuki Yoshioka, Nara, Japan

[73] Assignee: Sharp Kabushiki Kaisha, Osaka, Japan

[21] Appl. No.: 32,054

[22] Filed: Mar. 16, 1993

[30] Foreign Application Priority Data

Mar. 18, 1992 [JP] Japan ..................................... 4-62434

[51] Int. Cl.$^5$ ............................................... G11C 7/00
[52] U.S. Cl. ................................. 365/195; 365/187.01
[58] Field of Search .............. 365/195, 189.01, 189.07, 365/191

[56] References Cited

U.S. PATENT DOCUMENTS

| | | | |
|---|---|---|---|
| 4,580,246 | 4/1986 | Sibigtroth | 365/195 X |
| 4,665,506 | 5/1987 | Cline et al. | 365/195 X |
| 4,975,878 | 12/1990 | Boddu et al. | 365/189.07 |
| 5,016,219 | 5/1991 | Nolan et al. | 365/195 |
| 5,047,982 | 9/1991 | Smith et al. | 365/195 |
| 5,161,122 | 11/1992 | Robertson | 365/195 |

FOREIGN PATENT DOCUMENTS

3-130997 6/1991 Japan .
4-158458 6/1992 Japan .

*Primary Examiner*—Eugene R. LaRoche
*Assistant Examiner*—Son Dinh
*Attorney, Agent, or Firm*—Nixon & Vanderhye

[57] ABSTRACT

A memory device connected to a CPU and including a plurality of memory elements selectable between a writable state and an unwritable state, the CPU outputting an address signal for selecting at least one of the plurality of memory elements, data to be stored in the plurality of memory elements, and a write signal for selecting the writable state or the unwritable state of the plurality of memory elements to the memory device. The memory device includes an address decoder element for generating at least two select signals in response to the address signal; a first memory for storing first data outputted from the CPU in response to a first state select signal having a specified level for selecting the writable state or the unwritable state when a first two select signal is at a specified level; a second memory for storing and outputting second data outputted from the CPU in response to a second state select signal having a specified level for selecting the writable state or the unwritable state when a second select signal is at a specified level, the second data putting the first and the second memories into the unwritable state; and a logic operation element for performing logic operations of the write signal and the second data outputted from the second memory and outputting signals indicating results of the logic operations to the first and the second memories respectively. These signals are the first and the second state select signals.

16 Claims, 6 Drawing Sheets

TRUTH TABLE OF D-TYPE FLIP-FLOP

| INPUT | | | OUTPUT |
|---|---|---|---|
| $\overline{\text{RESET}}$ | D | CLK | Q |
| 0 | X | X | 0 |
| 1 | 0 | ↑ | 0 |
| 1 | 1 | ↑ | 1 |
| 1 | X | ↓ | $Q_{n-1}$ |

X : UNDEFINED

: TRANSITION FROM "0" TO "1"

: TRANSITION FROM "1" TO "0"

$Q_{n-1}$ : UNCHANGED

0 : ZERO

1 : ONE

MEMORY DEVICE AND A METHOD FOR PROHIBITING WRITING TO THE MEMORY DEVICE

BACKGROUND OF THE INVENTION

1. Field of the Invention:

The present invention relates to a memory device to be mounted on, for example, an IC card, and in particular, to a memory device in which data writing is prohibited by means of hardware and a method for prohibiting writing to such a memory device.

2. Description of the Related Art:

In a conventional memory device, such as conventional EEPROM (electrically erasable programmable read only memory), erroneous writing caused by misoperation when an apparatus in which the EEPROM is used is operated at a low voltage is prevented by detecting the voltage applied to the EEPROM and prohibiting writing until the voltage reaches a normal operation level. In such a system configuration, in other words, writing to the EEPROM is prohibited by means of hardware when the operating voltage is low, but no such prohibition is performed when the operating voltage is high.

An IC card, on which this type of EEPROM is mounted, requires a high degree of security. Accordingly, a conventional IC card has a configuration in which writing to an EEPROM is prohibited by means of software when the IC card is operated at a normal voltage. Namely, writing prohibition which is usually controlled by application software is controlled by programming software in such an IC card.

More partically, in the case when the validity of the IC card has expired, writing to an EEPROM is prohibited by programming software based on data stored in a built-in timer or data concerning dates sent from an external terminal, or rewriting of the registration of an issuer or the like is prohibited by means of software once such registration is made.

However, writing prohibition to an EEPROM only by programming software has a limit since writing to an EEPROM becomes possible when writing is commanded by runaway of the program or when the program is revised. Accordingly, a conventional memory device such an IC card including this type of EEPROM has a limit in improving the security thereof.

SUMMARY OF THE INVENTION

A memory device according to the present invention includes a memory array for storing data; a writing restriction register for prohibiting writing to the memory array and outputting a signal having a specified level; and a logic operation element for putting the writing restriction register into an unwritable state in response to a signal outputted from the writing restriction register and putting the memory array into the unrewritable state.

Alternatively, a memory device according to the present invention, connected to a CPU and including a plurality of memory elements selectable between a writable state and an unwritable state, the CPU outputting an address signal for selecting at least one of the plurality of memory elements, data to be stored in the plurality of memory elements, and a write signal for selecting one of the writable state and the unwritable state of the plurality of memory elements to the memory device, includes an address decoding element for generating at least two select signals in response to the address signal; a first memory element storing first data outputted from the CPU in response to a first state select signal having a specified level for selecting one of the writable state and the unwritable state when a first one of the two select signals is at a specified level; a second memory element for storing and outputting second data outputted from the CPU in response to a second state select signal having a specified level for selecting one of the writable state and the unwritable state when a second one of the two select signals is at a specified level, the second data putting the first and the second memory elements into the unwritable state; and a logic operation element for performing logic operations of the write signal and the second data outputted from the second memory element and outputting signals indicating results of the logic operations to the first and the second memory elements respectively, the signals indicating the results being the first and the second state select signals.

A method for prohibiting rewriting of data stored in a memory device according to the present invention, connected to a CPU and including first and second memory elements each selectable between a writable state and an unwritable state, the CPU outputting an address signal for selecting one of the plurality of memory elements, data to be stored in the plurality of memory elements, and a write signal for selecting one of the writable state and the unwritable state of the plurality of memory elements to the memory device includes the steps of setting initial data in the second memory element, the initial data having a specified level for putting the first memory element into the writable state before receiving the address signal, data to be stored, and the write signal from the CPU, and outputting the initial data from the second memory element; performing a first logic operation of the initial data and the write signal; outputting a state select signal indicating a result of the first logic operation for putting the second memory element into the writable state; writing first data to the first memory element when a first select signal is at a specified level; writing second data having a level inverse to the level of the initial data to the second memory element when a second select signal is at a specified level, and then outputting the second data; performing a second logic operation of the write signal and the second data; and outputting a writing prohibit signal indicating a result of the second logic operation and prohibiting writing to the first and the second memory elements, thereby putting the first and the second memory elements into the unwritable state.

Thus, the invention described herein makes possible the advantages of providing a memory device in which writing prohibition is performed by means of hardware thus to improve security thereof and a method for reliably prohibiting writing to the memory device.

These and other advantages of the present invention will become apparent to those skilled in the art upon reading and understanding the following detailed description with reference to the accompanying figures.

BRIEF DESCRIPTION OF THE DRAWINGS

FIG. 2b is a truth table of a D-type flip-flop of the circuit shown in FIG. 2a.

FIG. 5 is a timing chart of signals inputted and outputted through terminals of the second writing restriction register and terminals of the D-type flip-flop shown in FIGS. 1 and 2a.

DESCRIPTION OF THE PREFERRED EMBODIMENTS

Hereinafter, the present invention will be described by way of illustrating examples with reference to the accompanying drawing.

Data "0" and "1" denote signals levels according to positive logic.

Figure 1:
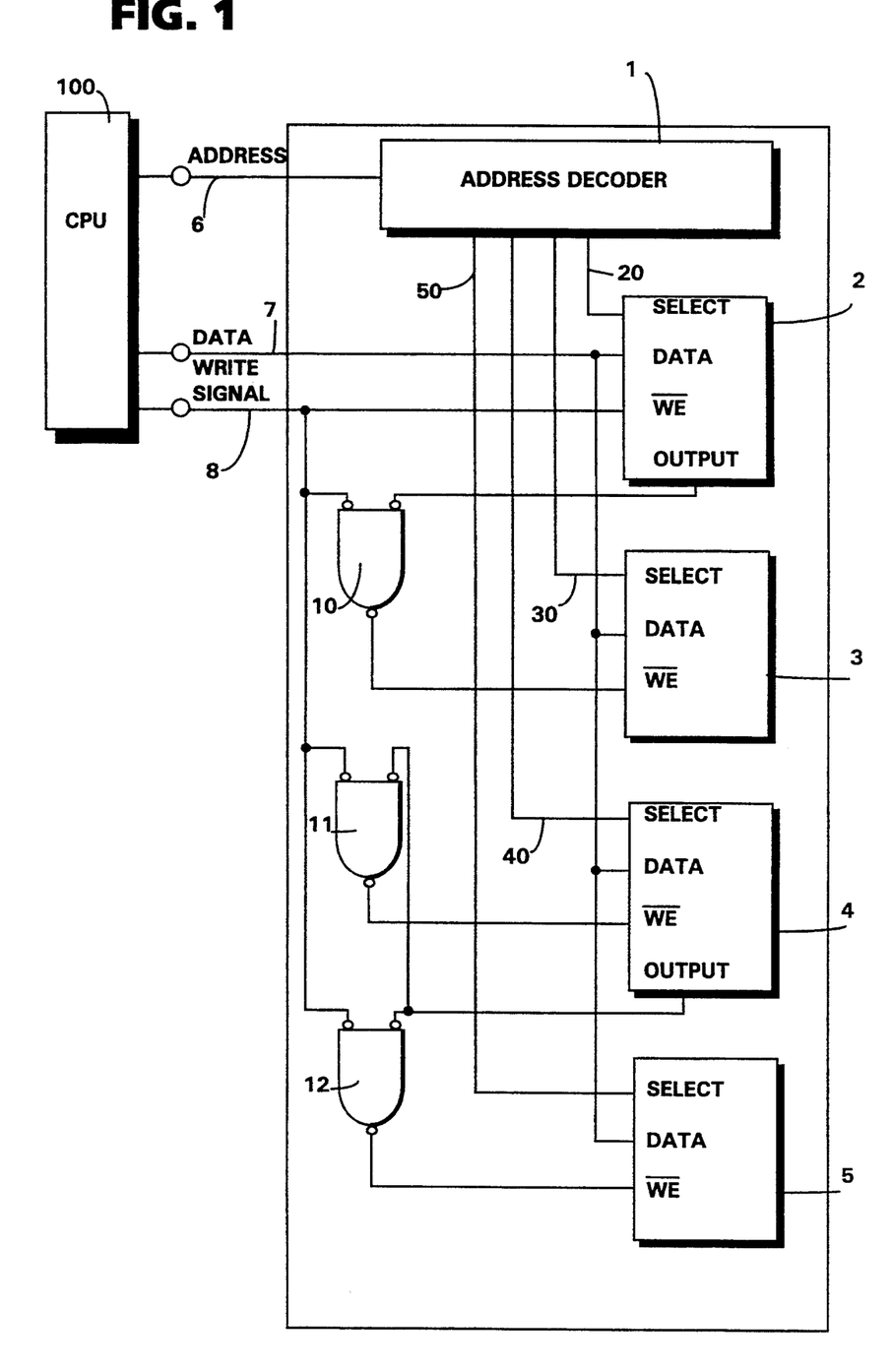
FIG. 1 is a view illustrating a system configuration of a memory device according to an example of the present invention.

FIG. 1 shows a system configuration of an EEPROM as an example of a memory device according to the present invention. The EEPROM includes an address decoder 1, a first writing restriction register 2, a first memory array 3, a second writing restriction register 4, and a second memory array 5 as circuit elements. The EEPROM further includes negative logic AND circuits 10, 11 and 12. The EEPROM is connected to a CPU (central processing unit) 100. In FIG. 1, the first and the second writing restriction registers 2 and 4, as well as the memory arrays 3 and 5, are allocated in a part of an address space of a memory of a computer system with the CPU 100. Control signals for reading data are omitted.

A detailed configuration of the EEPROM will be explained together with an operation thereof.

When an address signal is inputted from the CPU 100 to the address decoder 1 through an address bus 6, the address decoder 1 outputs select signals 20, 30, 40 and 50 to select signal input terminals of the first writing restriction register 2, the first memory array 3, the second writing restriction register 4, and the second memory array 5, respectively. Depending on the level of the select signals, one of the circuit elements is selected. Since there are four circuit elements from which one is selected in this example, the address bus 6 is a two-bit address bus.

Data is inputted from the CPU 100 to data input terminals Data of the first and the second writing restriction registers 2 and 4, and the first and the second memory arrays 3 and 5 through a data bus 7. A write signal is inputted from the CPU 100 to a write enable terminal $\overline{WE}$ of the first writing restriction register 2 through a control signal line 8.

The signal line 8 is also connected to first input terminals of the negative logic AND circuits 10, 11 and 12. A second input terminal of the negative logic AND circuit 10 is connected to an output terminal of the first writing restriction register 2. Second input terminals of the negative logic AND circuits 11 and 12 are both connected to an output terminal of the second writing restriction register 4. Output terminals of the negative logic AND circuits 10, 11 and 12 are connected to the write enable terminals $\overline{WE}$ of the first memory array 3, the second writing restriction register 4, and the second memory array 5, respectively.

The first writing restriction register 2, the first memory array 3, the second writing restriction register 4, and the second memory array 5 are put into a rewritable state when the select signals 20, 30, 40 and 50 inputted to the select signal input terminals thereof are at a high level and the write signals inputted to the write enable terminals $\overline{WE}$ thereof are at a low level.

In the above-mentioned system configuration, the first writing restriction register 2 is always in a rewritable state, and had a function of restricting writing to the first memory array 3 through the negative logic AND circuit 10.

The first memory array 3 is put into a rewritable state by writing data "0", which allows writing, to the first writing restriction register 2 so that data "0" will be outputted to the second input terminal of the negative logic AND circuit 10 from the first writing restriction register 2. In this state, when the level of the write signal also becomes low, the level of a signal outputted from the negative logic AND circuit 10 becomes low. The first memory array 3 is put into a rewritable state upon receiving such a low level signal at the write enable terminal $\overline{WE}$ thereof.

The first memory array 3 is put into an unrewritable state, namely, a write protect state by writing data "1" (a high level signal) to the first writing restriction register 2 so that data "1" will be outputted to the second input terminal of the negative logic AND circuit 10 from the first writing restriction register 2. In this state, even though the level of the write signal is low, data "1" (a high level signal) for prohibiting writing to the first memory array 3 is inputted to the write enable terminal $\overline{WE}$ thereof from the output terminal of the negative logic AND circuit 10. Thus, the first memory array 3 is put into a write protect state.

The above write protect state is released by writing data "0" to the first writing restriction register 2.

In the second writing restriction register 4, data "0" is set in an initial state to allow writing. In the initial state, when the write signal is at a low level, data "0" is inputted to the second input terminals of the negative logic AND circuits 11 and 12. Accordingly, signals outputted from the negative logic AND circuits 11 and 12 are at a low level, thereby putting the second memory array 5 into a writable state.

Figure 2A:
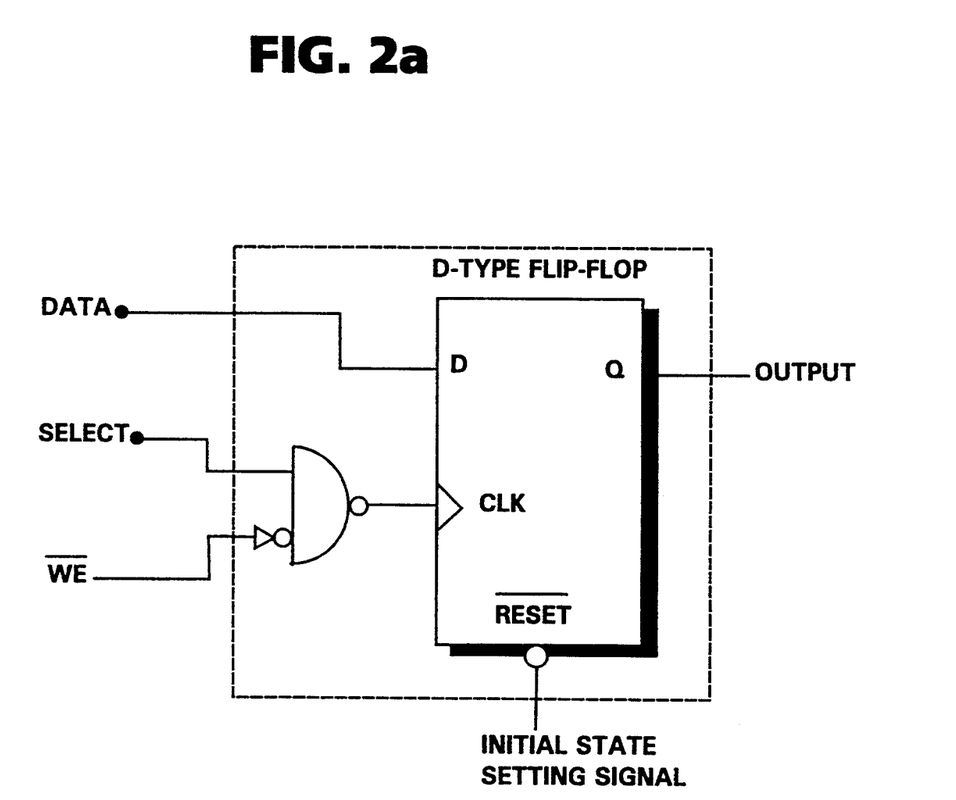
FIG. 2a is a view illustrating an example of a circuit diagram constituting a writing restriction register shown in FIG. 1.

FIG. 2a shows an example of a circuit diagram constituting each of the first and the second writing restriction registers 2 and 4. Such a circuit includes a D-type flip-flop, a NAND gate circuit, and an inverter. The D-type flip-flop has a date input terminal D, a clock input terminal CLK, an output terminal Q, and a reset input terminal $\overline{RESET}$. Data is inputted to the D-type flip-flop through the data input terminal Data of the second writing restriction register 4. A select signal is inputted to a first input terminal of the NAND circuit. A write signal is inputted to a second input terminal of the NAND circuit through the inverter. A signal outputted from the NAND circuit is inputted to the clock input terminal CLK of the D-type flip-flop. A reset signal is inputted to the reset input terminal $\overline{RESET}$. In FIG. 1, the reset input terminal $\overline{\text{RESET}}$ is not shown. A signal from the second writing restriction register 4 is outputted from the output terminal Q.

Figure 2B:
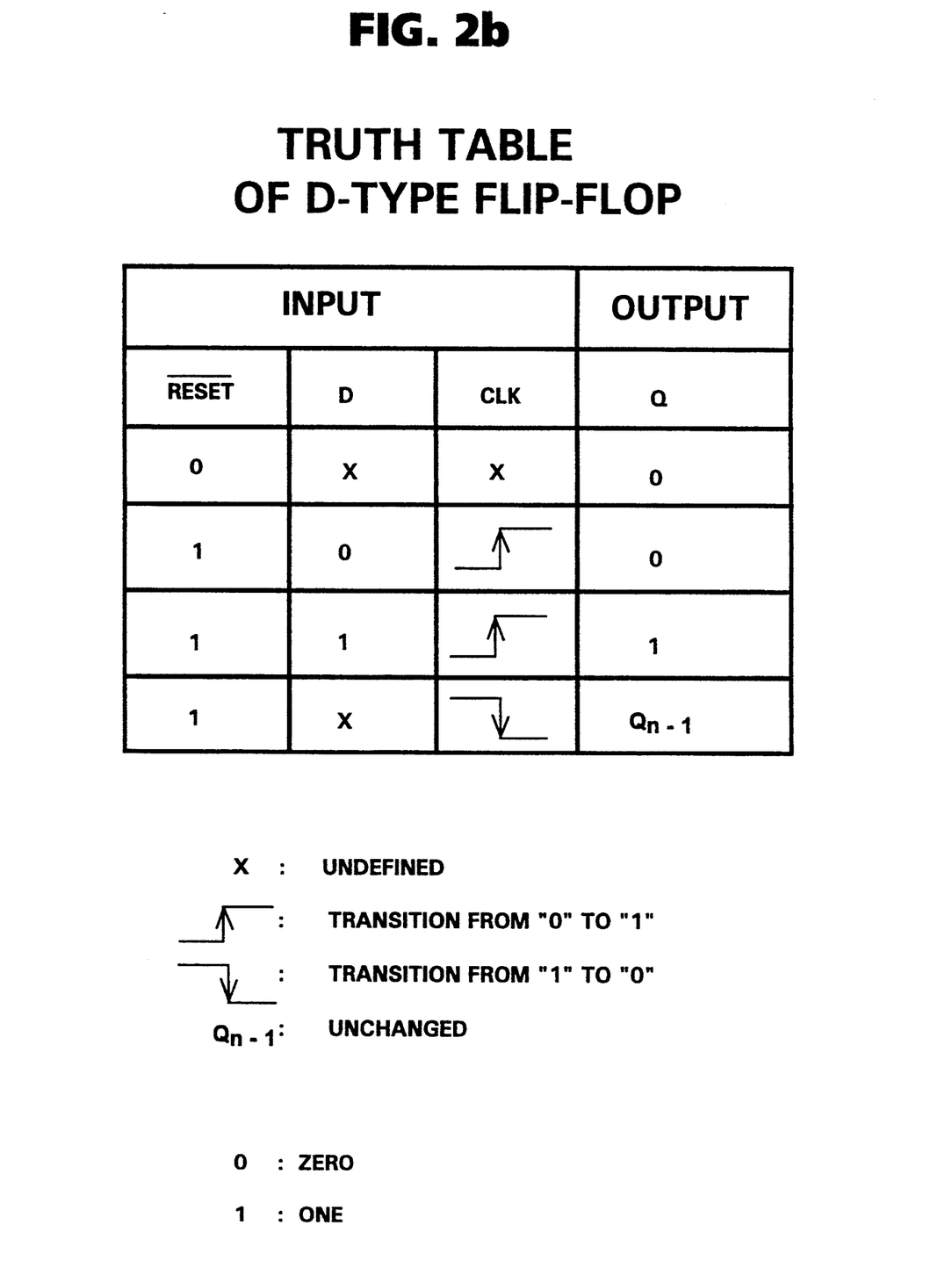

FIG. 2b is a truth table of the D-type flip-flop of the circuit shown in FIG. 2a. A symbol "0" denotes a zero in binary notation. A symbol "1" denotes a numeral one in binary notation. A symbol "X" denotes an undefined signal level. A symbol " " denotes a transition of a signal level from "0" (low) to "1" (high). A symbol " " denotes a transition of a signal level from "1" to "0". A symbol "$Q_{n-1}$" denotes a signal level to which a signal level in a previous state is unchanged. Symbols "$\overline{\text{RESET}}$", "D", "CLK", and "Q" are the terminals of the D-type flip-flop.

Figure 3:
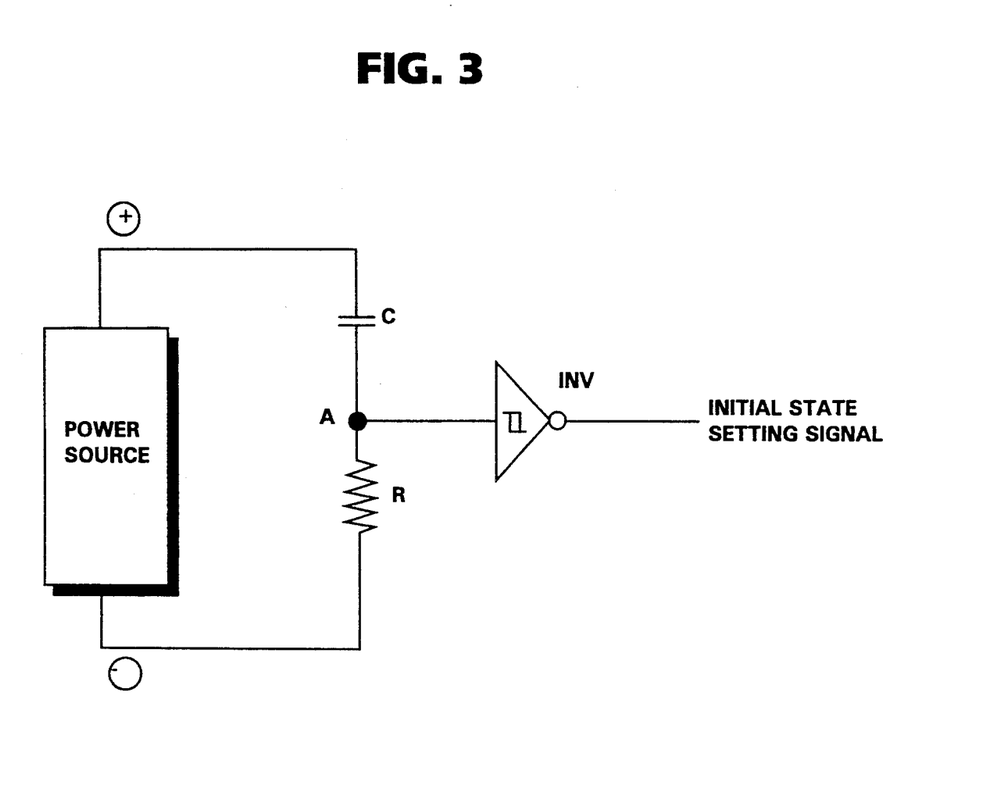
FIG. 3 is a view illustrating an example of a diagram of an initial state setting signal generation circuit in the memory device of the present invention.

FIG. 3 shows an example diagram of an initial state setting signal generation circuit for generating data "0" to be written to the second writing restriction register 4. The initial state setting signal generation circuit includes a capacitor C, a resistor R, and a Schmitt trigger inverter INV. A junction of the capacitor C and the resistor R is referred to as a node A. A node A is connected to an input terminal of the Schmitt trigger inverter INV. A terminal of the capacitor C opposite to the node A is connected to an anode (+) terminal of a DC power source, and a terminal of the resistor R opposite to the node A is connected to a cathode (−) terminal of the DC power source. An output terminal of the Schmitt trigger inverter INV is connected to the reset input terminal $\overline{\text{RESET}}$ of the D-type flip-flop shown in FIG. 2a.

Figure 4A:
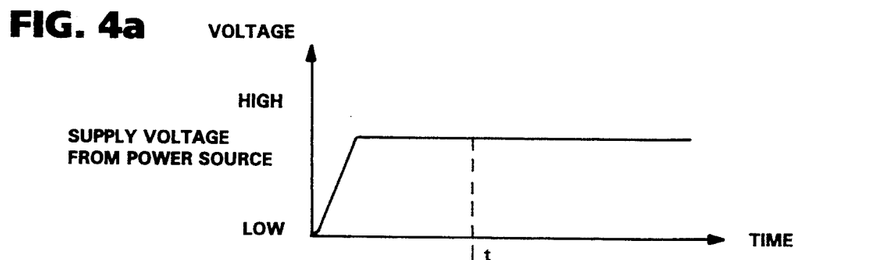
FIG. 4a is a view showing a signal waveform of a supply voltage of the initial state setting signal generation circuit shown in FIG. 3.
Figure 4B:
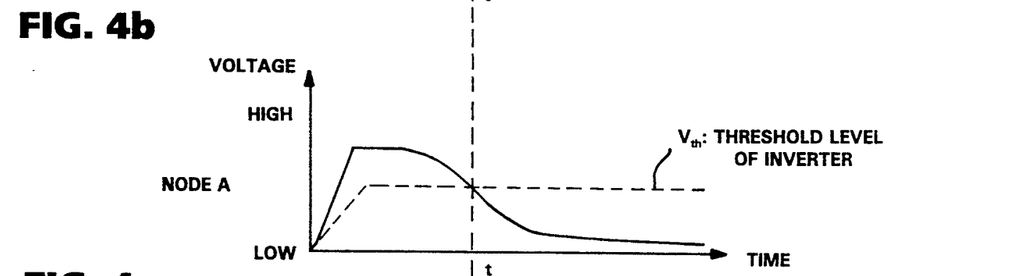
FIG. 4b is a view showing a signal waveform at a node A of the initial state setting signal generation circuit shown in FIG. 3.
Figure 4C:
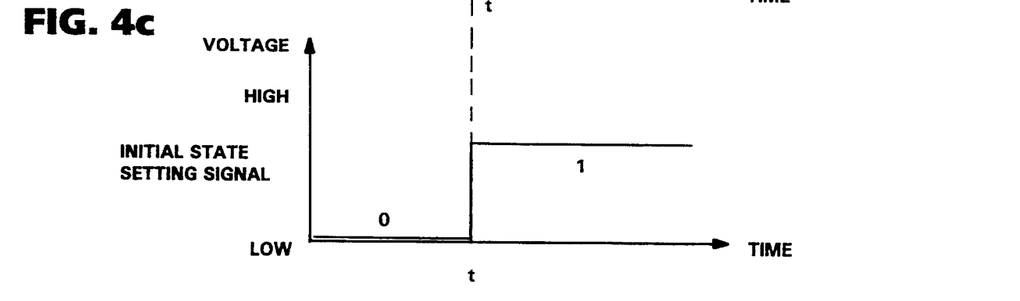
FIG. 4c is a view showing a signal waveform of a signal outputted from the Schmitt trigger inverter of the initial state setting signal generation circuit shown in FIG. 3.

FIG. 4a shows a signal waveform of a supply voltage of the intial state setting signal generation circuit. FIG. 4b shows a signal waveform at the node A of the initial state setting signal generation circuit. FIG. 4c shows a waveform of a signal outputted from the Schmitt trigger inverter INV of the initial state setting signal generation circuit.

Figure 5:
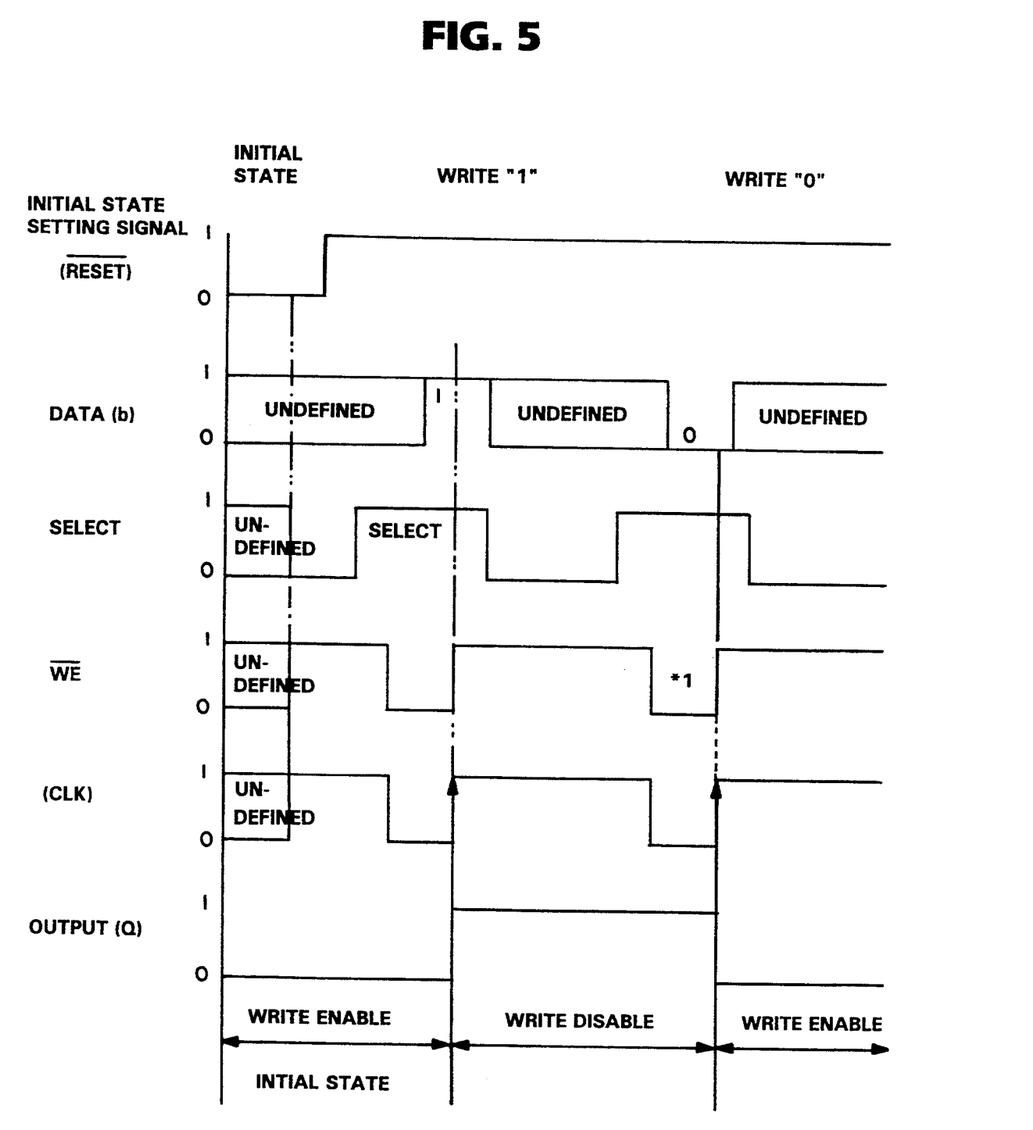

FIG. 5 is a timing chart of signals inputted and outputted through the terminals of the second writing restriction register 4 and the terminals of the D-type flip-flop.

An example of a circuit configuration and a circuit operation for putting the second writing restriction register 4 into an initial state will be described.

When a supply voltage is applied to the initial state setting signal generation circuit shown in FIG. 3 after the power is turned on (for example, after battery exchange), the node A obtains a potential substantially identical with the supply voltage, thereby allowing a charging current to flow to the capacitor C for a specified period. The amount of the charging current is gradually reduced until no charging current is allowed to flow after the specified period, whereby the potential of node A nearly becomes zero. When the level of the potential of the node A crosses a threshold voltage $V_{th}$ of the Schmitt trigger inverter INV at a time t during the specified period, the level of a signal outputted from the Schmitt trigger inverter INV is changed from low to high. Such a low level signal from the Schmitt trigger inverter INV is outputted to the reset input terminal $\overline{\text{RESET}}$ of the second writing restriction register 4. The data stored in the second writing restriction register 4 becomes "0" in response to such a low level signal.

When the level of the select signal 40 outputted from the address decoder 1 becomes high, the second writing restriction register 4 is selected. When data "1" is inputted from the CPU 100 to the second writing restriction register 4, the second input terminals of the negative logic AND circuits 11 and 12 receive data "1". Accordingly, the level of a signal outputted from the negative logic AND circuit 11 becomes high. Since such a high level signal is inputted to the write enable terminal $\overline{\text{WE}}$ of the second writing restriction register 4, the second writing restriction register 4 is put into an unrewritable state. In the same manner, the second memory array 5 is also put into an unrewritable state.

When the data stored in the second writing restriction register 4 is "1", the level of a signal outputted therefrom becomes high. Since such a high level signal is inputted to the second input terminal of the negative logic AND circuit 11, the level of a signal outputted therefrom becomes high irrespective of the level of a signal inputted to the first input terminal of the negative logic AND circuit 11. Since such a high level signal is inputted to the write enable terminal $\overline{\text{WE}}$ of the second writing restriction register 4, the second writing restriction register 4 is put into an unrewritable state, whereby data outputted therefrom is maintained "1" (a high level signal). Since such a high level signal from the second writing restriction register 4 is also inputted to the second input terminal of the negative logic AND circuit 12, the level of a signal outputted therefrom also becomes high. Since such a high level signal is inputted to the write enable terminal $\overline{\text{WE}}$ of the second memory array 5, the second memory array 5 is put into an unrewritable state.

In this manner, once the second writing restriction register 4 is put into an unrewritable state, data "0" cannot be written to the second writing restriction register 4 thereafter. Accordingly, writing to the second memory array 5 is permanently prohibited. In other words, the EEPROM having the abovementioned system configuration has a function of restricting writing by means of hardware.

In the case when such an EEPROM is mounted on an IC card, writing prohibition is still valid even when writing is commanded by runaway of the program or when the program is revised.

The D-type flip-flop shown in FIG. 2a may be replaced with a non-volatile memory device including a data input terminal D, a clock pulse input terminal CLK, an output terminal Q, and a test signal input terminal $\overline{\text{TST}}$. The test signal input terminal $\overline{\text{TST}}$ corresponds to the write enable terminal $\overline{\text{WE}}$ of the D-type flip-flop.

In the case when the non-volatile memory device is used instead of the D-type flip-flop, desirable data is written to a memory array after data "0" is inputted to the D-type flip-flop through the test signal input terminal $\overline{\text{TST}}$ in a production process of the EEPROM. By inputting data "1" through the test signal input terminal $\overline{\text{TST}}$ after the completion of writing to the second memory array 5, data for prohibiting writing to the second memory array 5 is set in the second writing restriction register 4 in an initial state.

The above writing restriction register can be constituted by a RAM, another EEPROM, or any other logic circuit. Although writing to the second memory array 5 is prohibited in the above example, the region of the memory array into which writing is prohibited, the number of memory arrays, and the size of the address are not limited to the one mentioned in the above example.

According to a memory device and a method for prohibiting writing to the memory device according to the present invention, a writing restriction register is put into an unrewritable state by a logic circuit, thereby putting a memory array into an unrewritable state. In such a system, once the writing restriction register is put into an unrewritable state, writing to the memory array is permanently prohibited. In other words, data writing is prohibited by means of hardware.

In the case when such a memory device is mounted on an IC card, writing prohibition is still valid even when writing is commanded by runaway of the program or when the program is revised. Thus, security of the IC card is significantly improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A memory device connected to a CPU and including a plurality of memory means selectable between a writable state and an unwritable state, the CPU outputting an address signal for selecting at least one of the plurality of memory means, data to be stored in the plurality of memory means, and a write signal for selecting one of the writable state and the unwritable state of the plurality of memory means to the memory device, the memory device comprising:

address decoding means for generating at least two select signals in response to the address signal;

first memory means for storing first data outputted from the CPU in response to a first state select signal having a specified level for selecting one of the writable state and the unwritable state when a first one of the two select signals is at a specified level;

second memory means for storing and outputting second data outputted from the CPU in response to a second state select signal having a specified level for selecting one of the writable state and the unwritable state when a second one of the two select signals is at a specified level, the second data putting the first and the second memory means into the unwritable state; and logic operation means for performing logic operations of the write signal and the second data outputted from the second memory means and outputting signals indicating results of the logic operations to the first and the second memory means respectively, the signals indicating the results being the first and the second state select signals.

2. A memory device according to claim 1, wherein the logic operation means is a negative logic AND circuit.

3. A memory device according to claim 1, wherein initial data is set in the second memory means for putting the first memory means into the writable state before receiving the address signal, the first and the second data, and the write signal from the CPU.

4. A method for prohibiting rewriting of data stored in a memory device connected to a CPU and including first and second memory means each selectable between a writable state and an unwritable state, the CPU outputting an address signal for selecting one of the plurality of memory means, data to be stored in the plurality of memory means, and a write signal for selecting one of the writable state and the unwritable state of the plurality of memory means to the memory device, the method comprising the steps of:

setting initial data in the second memory means, the initial data having a specified level for putting the first memory means into the writable state before receiving the address signal, data to be stored, and the write signal from the CPU, and outputting the initial data from the second memory means;

performing a first logic operation of the initial data and the write signal;

outputting a state select signal indicating a result of the first logic operation for putting the second memory means into the writable state;

writing first data to the first memory means when a first select signal is at a specified level;

writing second data having a level inverse to the level of the initial data to the second memory means when a second select signal is at a specified level, and then outputting the second data;

performing a second logic operation of the write signal and the second data; and outputting a writing prohibit signal indicating a result of the second logic operation and prohibiting writing to the first and the second memory means, thereby putting the first and the second memory means into the unwritable state.

5. A memory device, comprising:

a memory array for storing data;

a writing restriction register for prohibiting writing to the memory array as a function of data written to said writing restriction register and outputting a signal having a specified level as a result of said data being written to said writing restriction register; and logic operation means for receiving said signal output from said writing restriction register, for putting the writing restriction register into an unwritable state in response to said signal having said specified level outputted from the writing restriction register and for putting the memory array into the unrewritable state.

6. A memory device according to claim 1, wherein said second memory means comprises a D-type flip-flop.

7. A memory device according to claim 1, wherein said second memory means comprises a non-volatile memory device.

8. A memory device, comprising:

a first memory array and a second memory array;

a first writing restriction register operative in combination with a first logic means for selectively prohibiting writing to said first memory means as a function of data written to said first writing restriction register; and a second writing restriction register operative in combination with a second logic means for selectively prohibiting writing to said second memory means as a function of data written to said second writing restriction register.

9. A memory device according to claim 8, wherein at least one of said first and second writing restriction registers is always in a writable state.

10. A memory device according to claim 8, wherein at least one of said first and second writing restriction registers comprising means for selectively placing said at least one of said first and second writing restriction registers in an unwritable state as a function of said data written thereto.

11. A memory device according to claim 8, said first writing restriction register always being in a writable state, and said second writing restriction register comprising means for selectively placing said second writing restriction register in an unwritable state as a function of said data written thereto.

12. A memory device according to claim 8, wherein at least one of said first and second writing restriction registers comprises a D-type flip-flop.

13. A memory device according to claim 8, wherein at least one of said first and second writing restriction registers comprises a non-volatile memory.

14. A memory device according to claim 8, further comprising means for initializing said data written to at least one of said first and second writing restriction registers upon power being provided to said memory device.

15. A memory device according to claim 8, wherein said first and second memory arrays share a common data bus.

16. A memory device according to claim 8, wherein said first and second memory arrays and said first and second writing restriction registers all share a common data bus.

* * * * *

UNITED STATES PATENT AND TRADEMARK OFFICE
CERTIFICATE OF CORRECTION

PATENT NO. : 5,355,336
DATED : October 11, 1994
INVENTOR(S) : Katsuyuki YOSHIOKA

It is certified that error appears in the above-indentified patent and that said Letters Patent is hereby corrected as shown below:

Column 5, line 8, change "A symbol "   " denotes a transmission of a" to --A symbol "⌐" denotes a transmission of a--.

Column 5, line 10, change " "   " denotes" to --"⌐" denotes--.

Signed and Sealed this

Twentieth Day of December, 1994

BRUCE LEHMAN

*Attest:*

*Attesting Officer*     *Commissioner of Patents and Trademarks*